United States Patent [19]

Kameyama et al.

[11] Patent Number: 4,839,302
[45] Date of Patent: Jun. 13, 1989

[54] METHOD FOR FABRICATING BIPOLAR SEMICONDUCTOR DEVICE

[75] Inventors: Shuichi Kameyama, Itami; Tadao Komeda, Ikoma; Kazuhiro Kobushi, Osaka; Hiroyuki Sakai, Neyagawa, all of Japan

[73] Assignee: Matsushita Electric Industrial Co., Ltd., Osaka, Japan

[21] Appl. No.: 107,633

[22] Filed: Oct. 13, 1987

[30] Foreign Application Priority Data

Oct. 13, 1986 [JP] Japan ................. 61-242489
Nov. 6, 1986 [JP] Japan ................. 61-264553

[51] Int. Cl.⁴ .......................................... H01L 21/265
[52] U.S. Cl. .................................. 437/31; 437/33; 437/162; 357/59; 357/34; 148/DIG. 10; 148/DIG. 124
[58] Field of Search ............... 437/31, 32, 33, 162, 437/38; 148/DIG. 124, DIG. 10; 357/59 H, 34

[56] References Cited

U.S. PATENT DOCUMENTS

| | | | |
|---|---|---|---|
| 4,242,791 | 1/1981 | Horng et al. | 437/33 |
| 4,283,235 | 8/1981 | Raffel et al. | 437/31 |
| 4,343,080 | 8/1982 | Hataishi et al. | 437/31 |
| 4,407,060 | 10/1983 | Sakurai | 437/38 |
| 4,431,460 | 2/1984 | Barson et al. | 437/31 |
| 4,433,471 | 2/1984 | Ko et al. | 437/32 |
| 4,473,940 | 10/1984 | Kiriseko | 437/33 |
| 4,484,211 | 11/1984 | Takemoto et al. | 357/34 |
| 4,495,010 | 1/1985 | Kranzer | 437/31 |
| 4,717,678 | 1/1988 | Goth | 437/31 |
| 4,721,685 | 1/1988 | Lindenfelser et al. | 437/31 |
| 4,735,912 | 4/1988 | Kawakatsu | 437/33 |

Primary Examiner—Brian E. Hearn
Assistant Examiner—M. Wilczewski
Attorney, Agent, or Firm—Wenderoth, Lind & Ponack

[57] ABSTRACT

In a method for fabricating a favorable bipolar semiconductor device in which the extrinsic base and emitter diffusion holes are formed in self-alignment, an optimum structure between the extrinsic base and instrinsic base is realized. By controlling the concentration of the impurities in the extrinsic base, the base contact and emitter region can be finely formed in self-alignment, and occurence of damage or contamination in the intrinsic base region is inhibited.

1 Claim, 1 Drawing Sheet

METHOD FOR FABRICATING BIPOLAR SEMICONDUCTOR DEVICE

BACKGROUND OF THE INVENTION

This invention relates to a method for fabricating a bipolar semiconductor device, and more particularly to a method for fabricating a bipolar semiconductor device with the emitter and base contact positioned in self-alignment and possessing shallow emitter-base junction suited to high speed operation.

As one of the causes of characteristic fluctuations in the fabrication of integration of bipolar device, for example, the variation of the base resistance due to discrepancy in positioning of the emitter region and base-contact region is known. Due to the change in base resistance, in terms of DC, fluctuations of the base-emitter voltage occur, and pair performances of various analog devices is worsened, and in terms of AC, fluctuations of high speed switching speed are increased. To solve these problems, conventionally, for example as disclosed in the Japanese Pat. No. 1365508 (issued Feb. 26, 1987), after forming the base region of a vertical NPN transistor, emitter contact holes and base contact hole were formed in the insulation film on said base region, and the emitter region was formed from said emitter contact hole in order to form the base contact and emitter region by self-alignment to reduce the fluctuations of the base resistance, thereby stabilizing the characteristic changes. According to this technique, the base contact holes and the emitter region can be formed in self-alignment, but it is necessary to form an intrinsic base region before forming the emitter contact hole and base contact holes, and therefore it is frequently difficult to form the intrinsic base in a very shallow depth so as to be suited to high speed operation. Moreover, when anisotropic dry etching is employed for forming fine contact holes, etching damage or impurity ion contamination is likely to occur in the prospective part for forming the emitter, which often led to deterioration of device characteristics. Incidentally, without directly dry-etching on the prospective part for forming the emitter, a method of forming an intrinsic base region after forming emitter contact hole was disclosed, for example, in the 1984 International Electron Device Meeting Digest of Technical Papers (pp. 753–756). What is characteristic of this technique is the forming of an oxidation-resistant mask material pattern made of a silicon nitride film or the like on the intended part for forming the emitter, and, using it as the mask of diffusion, form an external base region around the prospective part for forming the emitter by the boron thermal diffusion with boron silicate glass (BSG), then, using this oxidation-resistant mask material pattern as the mask, oxidize selectively, thereby forming the emitter contact hole. Furthermore, by ion implantation of boron or the like, an intrinsic base is formed, and by ion implantation of arsenic or the like, an emitter is formed. In this method, however, since the diffusion length in the lateral direction from the external base to the intrinsic base by BSG is great, the dimensional change of the intrinsic base is great and since the emitter region is to be deeper than the damage layer part due to boron ion implantation for intrinsic base, it is necessary to form the emitter deeper. Therefore the base structure is not suited to high speed operation. Additionally, in this technique, the base contact holes are formed by a mask alignment method, and a self-aligned method for forming the base contact holes and emitter contact hole is not disclosed at all.

Furthermore, it is desired to open the contact holes of emitter, base and collector or the windows of diffusions simultaneously from the viewpoint of simplification of the process and the enhancement of yield.

Furthermore, it was difficult to achieve a fabricating method of forming the base contact and emitter region of highly integrated bipolar device finely in self-alignment, and preventing abnormal diffusions in the intrinsic base region, various damage layers to cause electric leaks, and occurrence of contamination.

SUMMARY OF THE INVENTION

It is hence a primary object of this invention to present a method of fabricating a semiconductor device realizing the enhancement of high speed operation of a bipolar device, by facilitating the introduction of a technique for forming a shallow junction by a polycrystalline semiconductor capable of forming a narrow intrinsic base suited to high speed operation while solving the above problems.

To realize this and other objects, this invention is intended to present a method for fabricating a bipolar semiconductor device comprising a step of selectively forming an insulation film around a prospective portion for forming a base on a first conductive the semiconductor layer, a step of forming an oxidation-resistant film material on said prospective portion for forming a base, a step of selectively leaving a mask material pattern on a prospective portion for forming an emitter on said oxidation-resistant film material, a step of forming a first semiconductor region as part of the base by implanting second conductive type impurity atoms into the prospective portion for forming the base using said selectively formed a said insulation film and said mask material pattern as masks, a step of selectively etching said oxidation-resistant film material using said mask material pattern as the mask, a step of forming an insulation film on the surface of said first semiconductor region by selectively oxidizing using said oxidation-resistant mask material pattern as the mask, a step of forming a second conductive type second semiconductor region in the base region around the prospective portion for forming the emitter, a step of forming a second conductive type third semiconductor region as an intrinsic base beneath the prospective portion for forming the emitter, and a step of forming a first conductive type fourth semiconductor region as the emitter in the prospective portion for forming the emitter.

Moreover, this invention presents a method of fabricating a bipolar semiconductor device comprising a step of selectively forming an insulation film around a prospective portion for forming a base on a first conductive type semiconductor layer, a step of forming an oxidation-resistant film material on said prospective portion for forming a base, a step of selectively leaving mask material patterns on prospective portions for forming base contacts and the prospective portion for forming an emitter on said oxidation resistant film material, a step of forming a first semiconductor region as part of the base by implanting a second conductive type impurity atoms into the prospective portion for forming a base using said selectively formed insulation film and said mask material pattern as masks, a step of selectively patterning said oxidation-resistant film material using said mask material pattern as the mask, a step of forming an insulation film on the surface of said first semiconductor region by selectively oxidizing by using said oxidation-resistant mask material pattern as the mask, a step of forming a second conductive type second semiconductor region in the prospective portion for forming base contacts, a step of forming a second conductive type third semiconductor region as an intrinsic base beneath the prospective portion for forming the emitter, a step of forming a first conductive type fourth semiconductor region as the emitter in the prospective portion for forming the emitter, and a step of forming electrode conductive patterns for the emitter and bases to connect with openings left over after removal of said oxidation-resistant mask material pattern.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

Referring now to FIG. 1 through FIG. 5, a series of fabrication processes of a bipolar vertical NPN transistor in one of the embodiments of this invention is described below.

Figure 1:
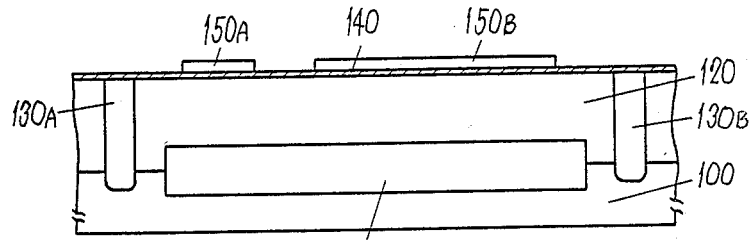
FIG. 1 through FIG. 5 are sectional views of processes showing a method of fabricating a bipolar NPN transistor in one of the embodiments of this invention.

First, as shown in FIG. 1, on a p-type semiconductor substrate 100, an n-type buried layer region 110 and an n-type epitaxial layer 120 of about 1 $\omega$-cm were formed. From the surface of the epitaxial layer, p-type semiconductor regions 130A, 130B for isolation of device were formed, and a silicon oxide film 140 of about 500 Å and silicon nitride film of about 1000 Å were sequentially formed on the surface of the epitaxial layer 120. By a photoetching process, this silicon nitride film was selectively etched, and silicon nitride film patterns 150A, 150B were formed.

Figure 2:
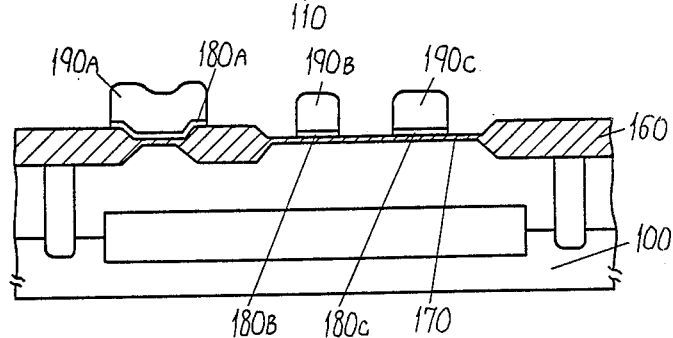

Using the silicon nitride film patterns 150A, 150B as oxidation-resistant masks, selective oxidation was done in about 6000 Å, and a thick silicon oxide film 160 was formed, and these silicon nitride film 150A, 150B and silicon oxide film 140 were removed, and an oxide film 170 of about 500 Å and a silicon nitride film of about 500 Å were newly formed. Consequently, by a photoetching process, photoresist patterns 190A, 190B, 190C were respectively formed in the prospective portions for forming collector contact, base contact and emitter contact, and using these photoresist patterns 190A, 190B, 190C as the mask, the silicon nitride film was etched, and silicon nitride film patterns 180A, 180B, 180C were formed as shown in FIG. 2.

Figure 3:
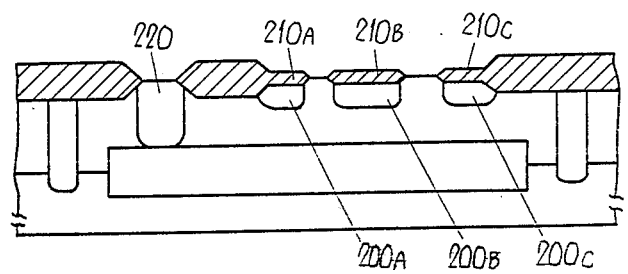

Next, using the photoresist patterns 190A, 190B, 190C as the mask, boron ions were implanted, and p-type first semiconductor regions 200A, 200B, 200C were formed as extrinsic bases, and photoresist patterns 190A, 190B, 190C were removed. Oxidizing selectively, then, by using silicon nitride film patterns 180A, 180B, 180C as the mask, silicon oxide films 210A, 210B, 210C were formed as a thin insulation film of about 2000 Å. By a photomask process, phosphorus ions were selectively implanted, and an n-type semiconductor region 220 for collector contact was formed. The silicon nitride films 180A, 180B, 180C and the silicon oxide film 170 and others on contacts were removed, and contact holes were exposed as shown in FIG. 3.

Figure 4:
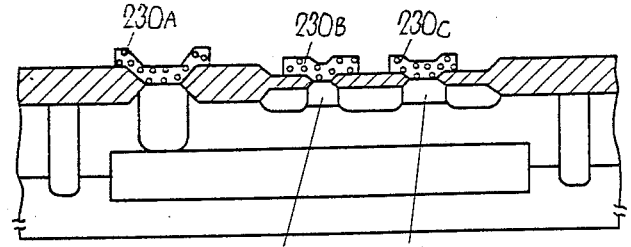

By depositing a polycrystalline silicon film of about 3000 Å on the entire surface, the film was etched in the photoetching process, and polycrystalline silicon patterns 230A, 230B, 230C were formed. By selectively implanting boron ions into the polycrystalline silicon patterns 230B, 230C, and then heating, a p-type second semiconductor region 240 A for a base contact and a p-type third semiconductor region 240B as an intrinsic base were formed as shown in FIG. 4. However, in this step, boron ions for a the base contact and for the intrinsic base may not be necessarily implanted by the same quantity, and it is more preferable to implant more ions for the base contact.

Figure 5:
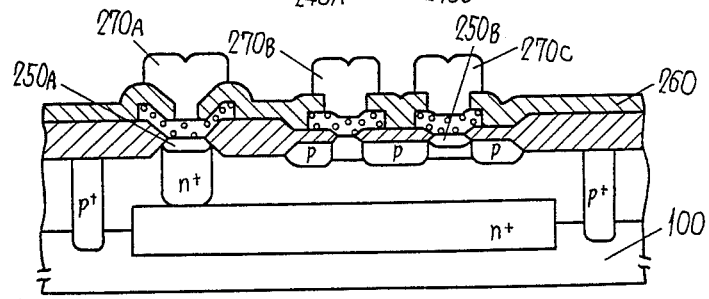

In consequence, as shown in FIG. 5, arsenic ions were selectively implanted into the polycrystalline silicon patterns 230A, 230C, and by heat treatment, an n-type semiconductor region 250A for a collector contact and an n-type fourth semiconductor region 250B as an emitter were formed. Then, according to the conventional fabrication method of an integrated circuit, openings were formed to reach the polycrystalline silicon patterns 230A, 230B, 230C which are conductive electrodes, in the silicon oxide film 260 as the insulation film, and an Al electrode 270A for the collector, Al electrode 270B for the base, and Al electrode 270C for the emitter were formed.

In this way, the base contact and emitter regions were formed in self-alignment in a series of fabrication process of this invention, and since the intrinsic base and emitter regions were formed by diffusion from the same polycrystalline silicon, the emitter depth is 500 Å and the base depth is 1500 Å, and hence an NPN transistor having an excellent high speed operation with a base width of about 1000 Å can be obtained.

An embodiment of this invention is illustrated in FIG. 1 through FIG. 5, and as required, other preferable methods may be employed in each step. For example, in FIG. 2, as the oxidation-resistant mask material, a silicon oxide film of about 500 Å and a silicon nitride film of about 500 Å were used, but as the composition of oxidation-resistant film, one layer or three or more layers may be used. Or instead of implanting boron ions as extrinsic base after etching this oxidation-resistant mask material by photoresist, it may also be possible to implant ions before etching the oxidation-resistant mask material. For etching the oxidation-resistant mask material, merely photoresist was used, but other film material may be used instead of the photoresist. In the true spirit of the invention, it is not strictly necessary that the film material of photoresist or the like for etching the oxidation-resistant mask material and the film material of photoresist or the like for implanting an extrinsic base be identical, and it is enough when the two materials may mutually keep the self-aligning relation. For example, after etching (patterning) a thick oxidation-resistant mask material, a so-called side wall film may be formed on the side of this mask material pattern, and borons for extrinsic base are implanted, and control of the electric breakdown voltage of the junction of the emitter and base is improved. For forming a semiconductor region of an intrinsic base, emitter, etc., in this embodiment, it was diffused from the polycrystalline silicon, but it is also possible to employ an ordinary diffusion source or direct ion implantation. Furthermore, generally, where the switching speed is particularly needed, it may be also considered to form another low resistance extrinsic base, by matching with the mask, outside of the extrinsic base formed in this embodiment. In the method of this invention, meanwhile, since the distance from the emitter to the base contact is kept in self-alignment, as compared with the method in which the distance of the emitter and base contact is determined by mask matching, fluctuations of the base resistance are small, and the intrinsic base and emitter can be formed by diffusion through the polycrystalline silicon. Accordingly, a very high speed etching may be achieved.

As illustrated in the embodiment hereabove, the benefits of the method of this invention when applied in NPN transistor may include, among others, the following.

When the means by this invention was applied in a bipolar vertical NPN transistor, the elements of each means brought about the following actions.

(1) Using the insulation film selectively formed around the prospective portion for forming a base and a mask material pattern selectively formed on the prospective portion for forming an emitter contact as masks, impurity ions were implanted, and a first semiconductor region formed was an extrinsic base. Since the extrinsic base was formed by ion implantation, the diffusion of the base impurity atoms in the lateral direction of the emitter side can be easily controlled by the dose of implantation, and the optimum design among the extrinsic base, intrinsic base and the emitter is easy to realize. By varying the combination of two mask materials, the NPN transistor may be formed in a so-called walled base structure or walled emitter structure, so that the junction capacity may be decreased.

(2) After selectively etching the oxidation-resistant mask material by the mask pattern for ion implantation above, by selectively oxidizing by using it as the mask, the base contact holes and emitter contact holes could be formed in self-alignment. Furthermore, the extrinsic base and emitter contact holes could also be formed in self-alignment. Since the surface of the emitter contact hole is not directly dry-etched, the emitter surface can be kept in a favorable condition, and fluctuations and deterioration of electrical characteristics of the NPN transistor can be prevented.

(3) When a polycrystalline semiconductor such as polycrystalline silicon is used as the electrode conductive material to be connected with the base contact hole or emitter contact hole, a greater advantage will be obtained. That is, polycrystalline silicon not containing impurity atoms is used as electrode conductive material, and at the same time this polycrystalline silicon is used as the impurity atom diffusion source of the intrinsic base to form a third semiconductor region as an intrinsic base. Similarly, by adding impurity atoms for the emitter to this polycrystalline silicon, the fourth semiconductor region as the emitter is formed. In this way, a very shallow junction is formed by forming the intrinsic base and emitter by two-step diffusion from the polycrystalline silicon film on the emitter contact, so that the switching speed may be enhanced. Since the intrinsic base is formed without directly implanting ions into the emitter region, damage layer due to ion implantation is not formed. Since the base contact hole and emitter contact hole are disposed in self-alignment, when polycrystalline silicon electrode is used, the mask matching allowance for polycrystalline silicon electrode and contact holes is required only once, the design is simplified, and the interval of contact holes may be reduced.

(4) Mask material patterns were formed to cover the whole surfaces of the prospective portion for forming base contact, the prospective portion for forming emitter contact, and the prospective portion for forming collector contact and after selectively etching the oxidation-resistant mask material by using mask material patterns as masks and selectively oxidating by using it as the mask, the base contact hole and emitter contact hole were disposed in self-alignment, and at the same time emitter contact hole was formed. Besides, by using the mask material patterns which cover the prospective portion for forming the emitter, base and collector, an extrinsic base region could be formed by ion implantation. In this case, since the entire surface on the prospective portion for forming the collector contact was covered with a mask material pattern, mixing of different conductive type impurities into the collector contact portion could be prevented. Furthermore, when selectively etching the oxidation-resistant mask material, a dry etching method was employed, but since the semiconductor surface in the emitter contact was not directly dry-etched, the surface of the emitter could be kept in a favorable state. As a result, fluctuations and deterioration of the transistor characteristics could be prevented.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim:

1. A method of fabricating a bipolar semiconductor device comprising the steps of:

selectively forming an insulation film around a prospective portion for forming a base on an epitaxial semiconductor layer of a first type of conductivity;

forming an oxidation-resistant film material pattern on the prospective portion for forming a base;

selectively leaving a mask material pattern on a prospective portion for forming an emitter on the oxidation-resistant film material pattern;

selectively etching the oxidation-resistant film material pattern using the mask material pattern as a mask;

forming a first semiconductor region as a part of the base by implanting impurity atoms of a second type of conductivity which is different from the first type of conductivity into the prospective portion for forming the base using the selectively formed insulation film and the mask material pattern as the mask;

diffusing the impurity atoms of the second type of conductivity in a lateral direction;

forming an insulation film on a surface of the first semiconductor region by selectively oxidizing using the oxidation-resistant film material pattern as the mask;

forming a second semiconductor region of the second type of conductivity in the base region around the prospective portion for forming an emitter;

exposing an emitter contact by removing the oxidation-resistant film material pattern used in the selective oxidation.

forming a polycrystalline semiconductor electrode on the emitter contact;

forming a third semiconductor region of the second type of conductivity as an intrinsic base beneath the prospective portion for forming the emitter by implanting impurity atoms of the second type conductivity into the polycrystalline semiconductor electrode and diffusing the impurity atoms of the second type of conductivity so as to prevent damage in the intrinsic base; and forming a fourth semiconductor region of the first type of conductivity as the emitter in the prospective portion or forming the emitter by implanting impurity atoms of the first type of conductivity into the polycrystalline semiconductor electrode an diffusing the impurity atoms of the first type of conductivity so as to prevent damage in the emitter;

whereby the diffusion of the impurity atoms of the second type of conductivity of the first semiconductor region in the lateral direction of the emitter side is controlled by a dose of implantation to improve the electric breakdown voltage of the junction of the emitter and base.

* * * * *